United States Patent [19]

Sato et al.

[11] Patent Number: 4,715,501
[45] Date of Patent: Dec. 29, 1987

[54] IC TEST EQUIPMENT

[75] Inventors: Hiroshi Sato; Yoshihito Kobayashi, both of Tokyo, Japan

[73] Assignee: Takeda Riken Co., Ltd., Tokyo, Japan

[21] Appl. No.: 749,274

[22] Filed: Jun. 27, 1985

[30] Foreign Application Priority Data

Jun. 29, 1984 [JP] Japan .............................. 59-98843[U]
Jun. 29, 1984 [JP] Japan .............................. 59-98847[U]
Jun. 29, 1984 [JP] Japan .............................. 59-98848[U]

[51] Int. Cl.⁴ ..................... B07C 5/342; B65G 57/30; B65G 59/06
[52] U.S. Cl. .................................... 209/573; 414/96; 414/126; 209/571
[58] Field of Search ................... 209/573, 574, 571; 414/96, 108, 330, 126

[56] References Cited

U.S. PATENT DOCUMENTS

| | | | |
|---|---|---|---|
| 1,292,635 | 1/1919 | Parker | 414/96 |
| 1,652,698 | 12/1927 | Boettger | 414/96 X |
| 3,587,852 | 5/1969 | Kamm et al. | 209/573 |
| 3,758,122 | 9/1973 | Kawaharaski | 414/96 X |
| 3,844,423 | 10/1974 | Loomer et al. | 414/96 |
| 4,234,418 | 11/1980 | Boissicat | 209/542 |
| 4,423,815 | 1/1984 | Boissicat | 209/573 X |

FOREIGN PATENT DOCUMENTS

| | | | |
|---|---|---|---|
| 213338 | 5/1959 | Fed. Rep. of Germany | 414/96 |
| 2803428 | 8/1978 | Fed. Rep. of Germany | |
| 190286 | 1/1959 | Sweden | 414/96 |

OTHER PUBLICATIONS

Patent Abstracts of Japan, vol. 6, No. 84, (P-117) (962), 22nd May 1982; & JP-A-5722570, (Fujitsu K. K.), 05-02-1982.

Primary Examiner—Robert B. Reeves
Assistant Examiner—Glenn B. Foster
Attorney, Agent, or Firm—Staas & Halsey

[57] ABSTRACT

Magazines, each loaded in series with IC elements to be tested, are stacked and such stacked magazines are arranged in columns. The lowermost magazines of the stacked magazines of the respective columns are simultaneously brought down by a takeout mechanism onto a magazine receiver, and the magazines on the magazine receiver are simultaneously but intermittently fed by intermittent stepping means in the direction of their arrangement. The outermost one of the magazines on the magzine receiver is loaded at an IC element receiving position. The IC elements from the magazine are supplied to a testing station, wherein they are tested, and the tested IC elements are sorted in a sorting station according to their test results and respectively then loaded into IC element receiving magazines in an accumulating station. The accumulating station has an IC receiving magazine stocker room in which IC element receiving magazines are stacked, and an empty magazine stocker room in which empty magazines are stacked. The empty magazines are taken out, one by one, by takeout and loading means from the empty magazine stocker room and each empty magazine is loaded at the position of a selected IC receiving magazine from underneath, pushing it up in the IC element receiving magazine stocker room.

8 Claims, 12 Drawing Figures

IC TEST EQUIPMENT

BACKGROUND OF THE INVENTION

The present invention relates to IC test equipment, and more particularly to improvement in its arrangement for feeding IC elements to a testing station, sorting them according to their test results and receiving the sorted IC elements by corresponding magazines.

In this kind of IC test equipment heretofore employed, IC elements are usually equally oriented and aligned in a long and thin, square tube-like magazine. The magazine is manually placed at an IC element feed position for sequentially feeding the IC elements to the testing station, and after completion of the feeding of the IC elements, the magazine is manually unloaded to be replaced with another magazine fully loaded with IC elements. In some conventional equipment, magazines are automatically loaded and unloaded. In the latter case, according to the prior art, a plurality of magazines, each carrying IC elements, are stacked and the lowermost one of the stacked magazines is taken out and brought to the IC element feed position. In this instance, a relatively large amount of time is needed for taking out the lowermost magazine, limiting the feed rate of the IC elements to the testing station. With a view to testing a large number of IC elements as quickly as possible, it has been proposed to provide a plurality of test passages in the testing station so that IC elements are simultaneously tested in these passages. Even if the processing rate of the testing station is increased, however, the conventional automatic IC element loading station encounters such a problem that the supply of IC elements therefrom to the testing station cannot keep up with the processing by the latter.

In the IC element receiving station of the conventional test equipment, empty magazines are stacked in side-by-side relation to a non-defective IC element receiving magazine, and when the latter is loaded to full capacity with IC elements, it is automatically pushed up and the lowermost one of the stacked empty magazines is taken out and inserted under the fully loaded magazine. On the other hand, since the number of defective IC elements is extremely smaller than the number of non-defective elements, loading and unloading of a defective IC element receiving magazine are not automated, that is, when the operator notices that the magazine is fully loaded with defective IC elements, he manually replaces it with an empty magazine. The IC element receiving station of the conventional equipment is automated only partly, as described above, so the operator's manual operation is required. In the case of quickly testing a large number of IC elements, the defective IC element receiving magazine must also be replaced relatively frequently, increasing the burden on the operator.

It is necessary that each IC element guided on a rail from the sorting station be smoothly transferred to the IC element receiving station. Since IC elements appreciably differ in size according to their types, the guide rail has a plurality of grooves so as to guide any kinds of IC elements, but the IC element receiving magazine is replaced with another magazine of a different size for each kind of IC element. Accordingly, magazine guide means for positioning the magazine relative to the guide rail in the IC element receiving station have to be replaced according to the kind of IC element handled, that is, the size of the magazine. Therefore, the prior art requires the preparation of plural kinds of magazine guides and involves a cumbersome operation of replacing them according to the type of IC elements handled.

Also in the IC element loading station, in the case of automatically taking out stacked magazines one by one and loading them at the IC element feed position, magazine guides for positioning the stacked magazines must be exchanged for each kind of IC element.

SUMMARY OF THE INVENTION

It is therefore an object of the present invention to provide IC test equipment which is capable of feeding IC elements to the testing station at a relatively high feed rate, permitting a reduction of the time for testing the IC elements.

Another object of the present invention is ro provide IC test equipment which lightens the burden imposed on the operator.

Another object of the present invention is to provide IC test equipment which automatically replaces not only a nondefective IC element receiving magazine but also a defective IC element receiving magazine in the sorted IC element accumulating station and enables an effective use of empty magazines and the magazine replacement mechanism.

Yet another object of the present invention is to provide IC test equipment in which magazines can be guided and positioned by relatively simple adjustment according to their type without the necessity of preparing various kinds of magazine guides.

In accordance with an aspect of the present invention, the IC element loading station has a magazine stocker in which magazine positioning means is provided so that it is possible to stack magazines at predetermined positions and to arrange such stacks of magazines in columns. Magazine receivers extending in the direction of arrangement of such stacks of magazines are disposed in opposing relation to the lowermost ones of stacked magazines. The lowermost magazines are simultaneously brought down onto the magazine receivers by means of a takeout mechanism. The magazines thus placed on the magazine receivers are simultaneously but intermittently fed by stepping means in the direction of their arrangement. The outermost one of the magazines thus fed is brought by carrier means to the IC element feed position.

In the IC element loading station, a pair of magazine guide bars are provided, as the magazine positioning means, in opposing relation to each row of the stacked magazines so that magazines can be positioned and stacked between the guide bars. The spacing of the magazine guide bars of each pair can be adjusted by moving them an equal distance in opposite directions through use of adjusting means. That is, the spacing of the guide bars is adjusted by adjusting means in accordance with the type of the magazine used.

In accordance with another aspect of the present invention, magazines can be stacked in an empty magazine stocker room of the sorted IC element accumulating station, and such stacks of magazines can be arranged in columns in an IC element receiving magazine stocker room as well. The lowermost ones of the stacked magazines are respectively disposed on IC element passages on which IC elements sorted in the sorting station are delivered therefrom. The empty magazine stocker room and the IC element receiving magazine stocker room are provided side by side, under which a carrying table is provided in a manner to reciprocate therebetween. In the empty magazine stocker room the lowermost one of the stacked empty magazines is transferred by takeout means onto the carrying table, which is then moved to a position under the IC element receiving magazine stocker room, and the empty magazine on the carrying table is positioned by loading means on a selected one of the IC element passages in the IC element receiving magazine stocker room.

In the IC element receiving magazine stocker room, a pair of magazine guide bars are provided for each column of stacked magazines so that magazines are positioned and stacked between the guide bars. The spacing of the magazine guide bars of each pair can be adjusted by moving them an equal distance in opposite direction through use of adjusting means, namely, the spacing of the magazine guide bars is changed by the adjusting means in accordance with the type of the magazine used.

DESCRIPTION OF THE PREFERRED EMBODIMENTS

To facilitate a better understanding of the present invention, a description will be given first, with reference to FIGS. 1 and 2, of the general arrangement of IC test equipment of the present invention.

Figure 3:
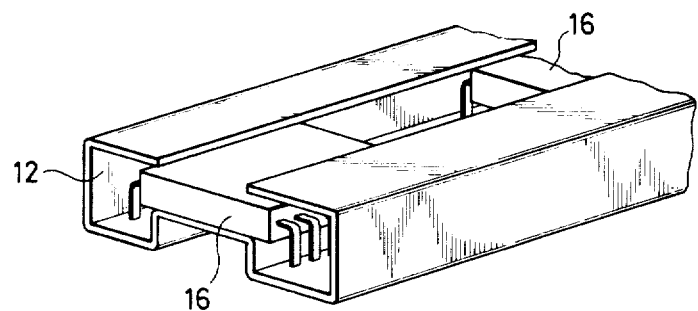
FIG. 3 is a perspective view illustrating a part of an example of an IC receiving magazine.

In a magazine stocker 13 of an IC element loading station 11 are stored a number of bar-shaped IC containers commonly referred to as magazines 12, in each of which oriented IC elements 16 are aligned, as shown in FIG. 3. The magazines 12 housed in the magazine stocker 13 are brought up one by one, by means of a lift mechanism, though not shown, to an IC element feed position where the magazine 12 is disposed aslant forwardly, as indicated by 12a in FIG. 1. After releasing all the IC elements from the magazine 12, another magazine is automatically pulled up to the IC element feed position.

The IC elements 16 in the magazine 12 are fed onto a rail 15 of an intermittent feed mechanism 14 and held there by a holder 17. The IC elements 16 thus held on the rail 15 are automatically fed one by one, by their own tare, to a distributor 18 disposed downwardly of the intermittent feed mechanism 14. The distributor 18 is constituted by a plurality of moving rails 21 arranged on a carrier 19. The carrier 19 moves in a direction perpendicular to the direction of feed of the IC elements 16 from the intermittent feed mechanism 14 so that the IC elements 16 are distributed onto the rails 21. The moving rails 21 are arranged at substantially regular intervals.

Disposed downwardly of the distributor 18 is a preheating station 22, in which plural, eight heating rails 23 in this example, are arranged side by side. The spacing of the heating rails 23 is selected equal to the spacing of the moving rails 21 so that the IC elements 16 can simultaneously be fed from the moving rails 21 onto the corresponding heating rails 23. The preheating station 22 is provided with guides 25 which are disposed in opposing relation to the heating rails 23 and can be moved back and forth with respect to them. The guides 25 prevent the IC elements 16 from running off the heating rails 23 when sliding down them. When heating the IC elements 16 by heaters 24 incorporated in the heating rails 23, the guides 25 are brought down to urge the IC elements 16 against the rails 23. At this time, the IC elements 16 are heated by the heaters 26 provided in the guides 25 as well. At the lower end portion of the preheating station 22 is provided an intermittent feed mechanism 27, by which IC elements 16 heated by the preheating station 22 are fed one by one to a direction changing mechanism 28. In this instance, the intermittent feed mechanism 27 presses only the IC elements 16 second from the bottom, letting the lowermost elements 16 come down to the direction changing mechanism 28. The direction changing mechanism 28 reverses the orientation of the IC elements 16 by turning upside down the rails on which the IC elements 16 are mounted.

The lower end of each rail thus turned upside down by the direction changing mechanism 28 is continuous to the upper end of a testing station 29. The testing station 29 is provided with eight heating rails 31 which respectively receive eight IC elements 16 which are simultaneously supplied from the direction changing mechanism 28. The heating rails 31 extend substantially vertically and have heaters 32 incorporated therein respectively. The IC elements 16, which slide down the heating rails 31, are guided by a guide member 33 so that they do not run off the rails 31. The guide member 33 has incorporated therein heaters 34 and heat the IC elements 16 while urging them against the heating rails 31. The testing station 29 is provided with a mechanism which performs a predetermined test of each IC element 16 with its terminal pins held in touch with contacts, though not shown. In general, a test head equipped with the above contacts is detachably mounted on the testing station 29 on the opposite side from the guide member 33 so that it supplies test signals to the IC element placed in the testing station 29 at a test position and receives its output. The test head is connected to the test equipment. Incidentally, the testing station 29 constitutes a main heating section as well to keep the IC elements 16 at a preset temperature.

The IC elements 16 thus tested are respectively supplied to discharge rails 35 provided just under the testing station 29. The discharge rails 35 are connected to a sorting station 36. The sorting station 36 has sorting rails 37 which are movable in the direction of arrangement of the discharge rails 35. The tested IC elements 16 are supplied from the discharge rails 35 to the sorting rails 37, which are moved so that the IC elements 16 are selectively fed onto non-defective or defective product rails 38 depending upon the test results, i.e. depending upon whether they are nondefective or defective. The rails 38 are arranged in the direction of movement of the sorting rails 37. The rails 37 are respectively linked with those of magazines 41 in an IC element receiving magazine accumulating station 39 corresponding to them, to which are supplied the IC elements 16 from the rails 38. In this way, the IC elements 16 are distributed onto, for example, eight test passages in this example, and tested in parallel, thereafter being sorted and fed to the different magazines 41 in the common accumulating station 39 depending upon whether they are non-defective or defective.

Incidentally, conventional test equipment of this kind is usually provided with two test passages and the sorting station uses only one sorting rail. With a view to rapid processing by the sorting station 36, however, the present invention employs the plurality of sorting rails 37 so as to simultaneously receive the IC elements 16 from the plurality of discharge rails 35.

Figure 1:
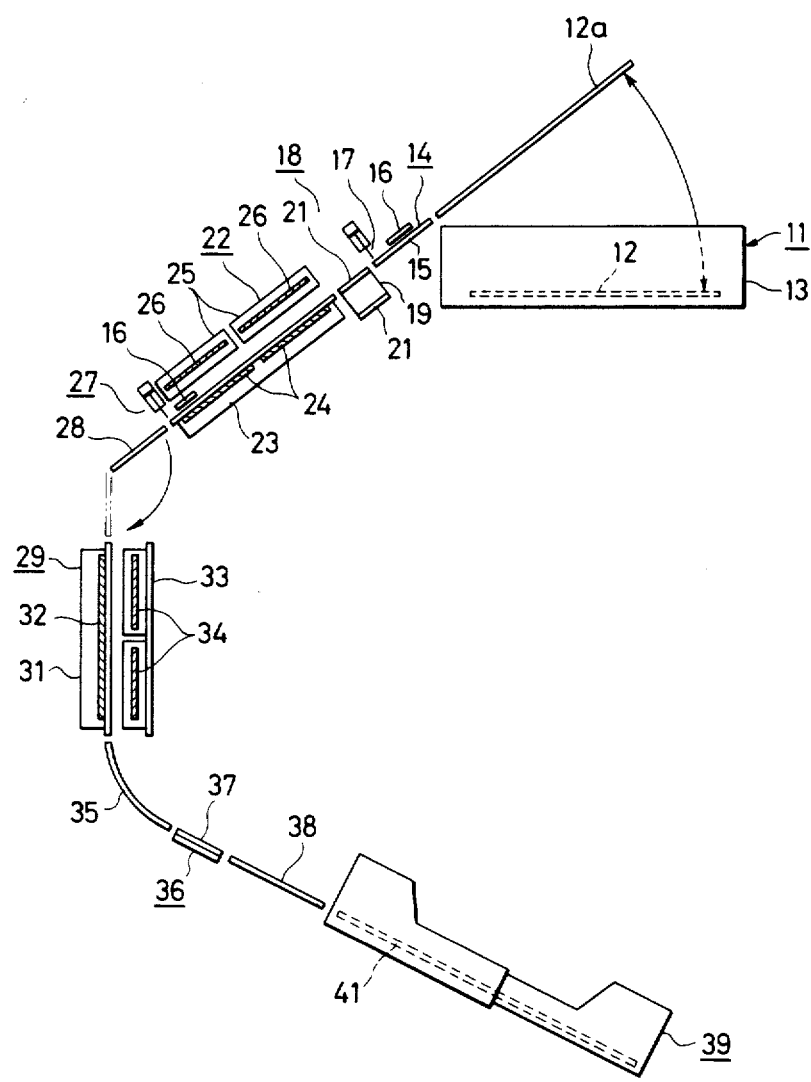
FIG. 1 is a side view showing the outline of movement of IC elements in the IC test equipment of the present invention.
Figure 2:
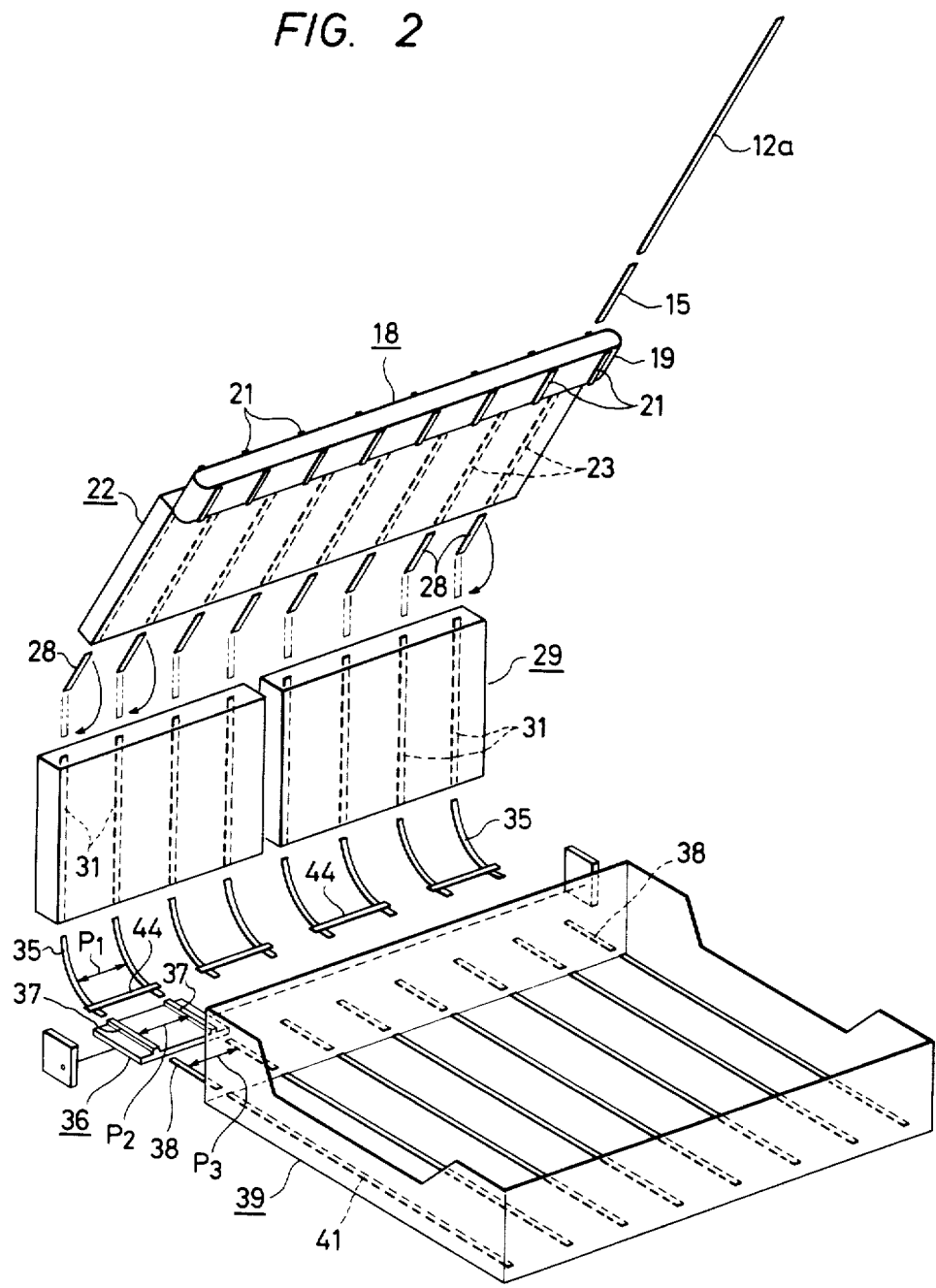
FIG. 2 is a perspective view of the test equipment shown in FIG. 1.
Figure 4:
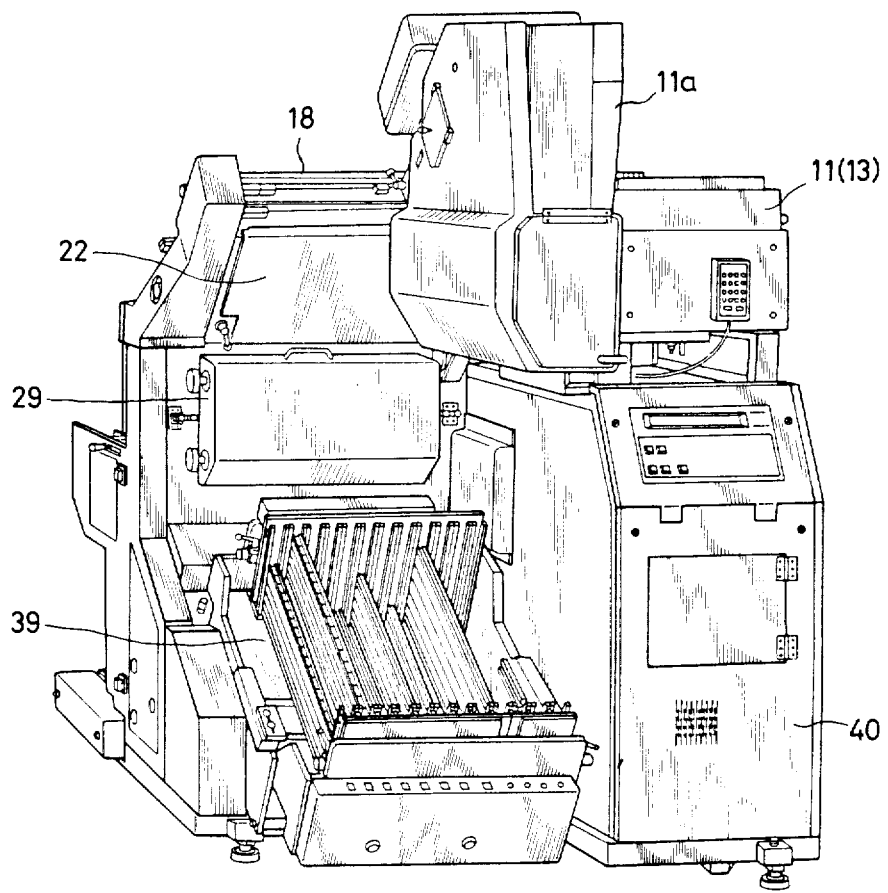
FIG. 4 is a perspective view showing an external appearance of an example of the IC test equipment of the present invention.

FIG. 4 shows an external appearance of the equipment depicted in FIGS. 1 and 2. In FIG. 4, the like parts corresponding to those in FIGS. 1 and 2 are identified by the same reference numerals. Disposed on a controller 40 is the magazine stocker 13 of the IC element loading station 11, at one side of which is provided the lift mechanism indicated by 11a. At one side of the controller 40 the distributing station 18, the preheating station 22, the testing station 29, the accumulating station 39 and so forth are provided in this order. The guide members 25 and 33 of the preheating station 22 and the testing station 29 are adapted to be detachable. The controller 40 controls the respective parts of the equipment.

Figure 5:
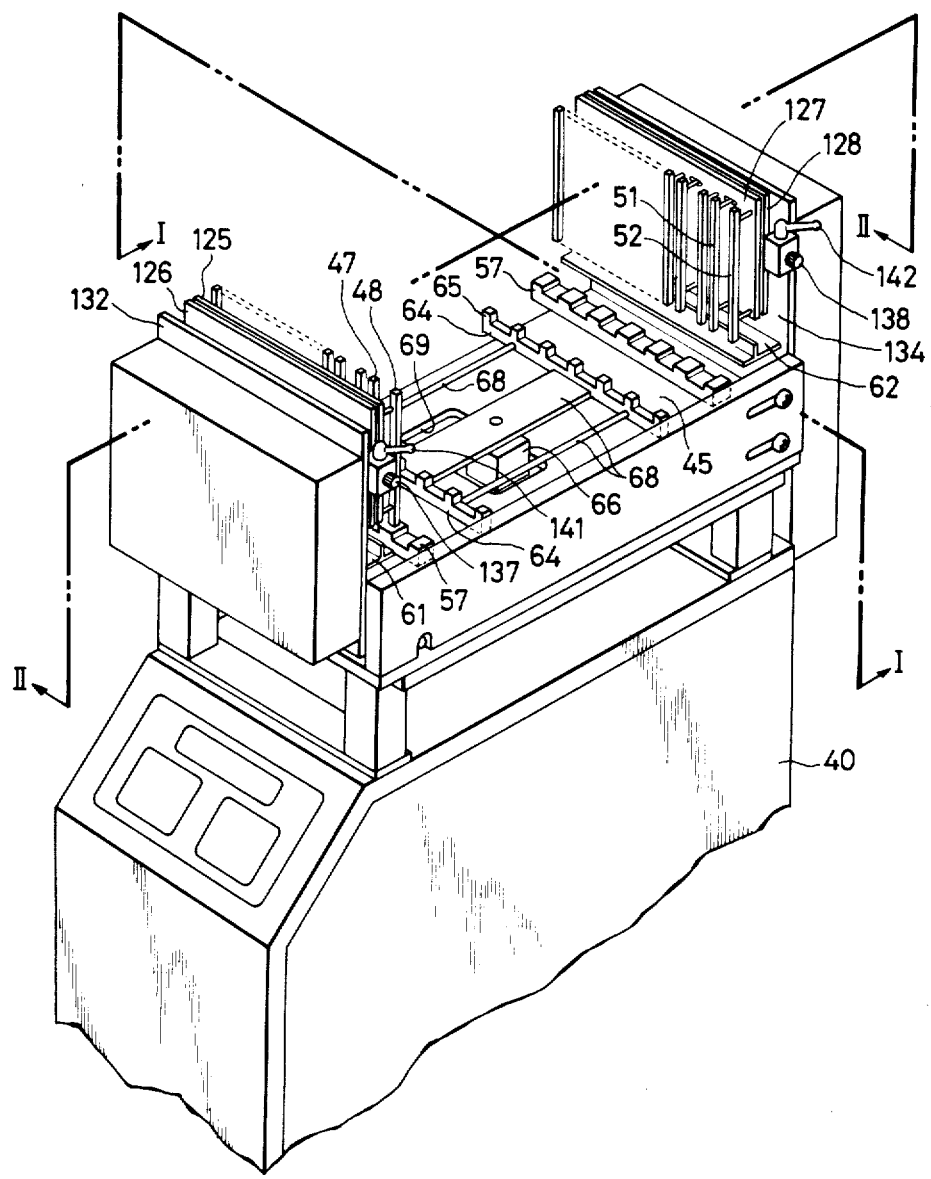
FIG. 5 is a perspective view showing an outward appearance of an example of a loading station 11.
Figure 6:
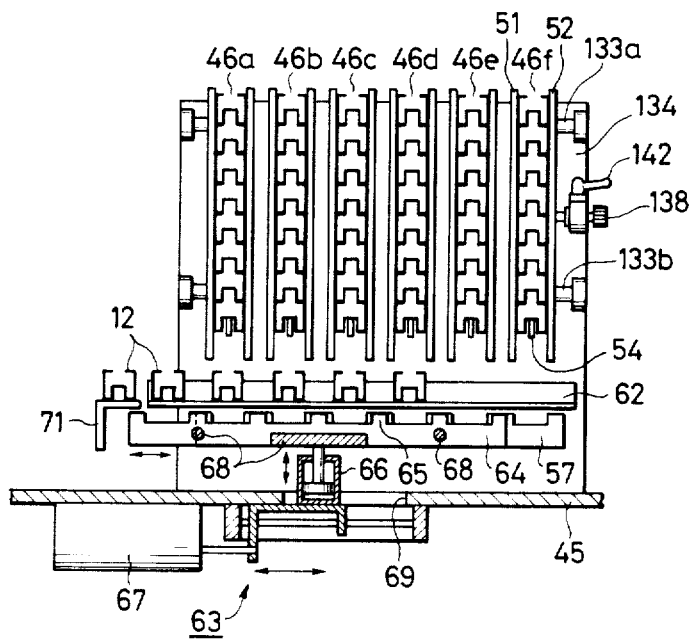
FIG. 6 is a sectional view taken on the line I—I in FIG. 5.
Figure 7:
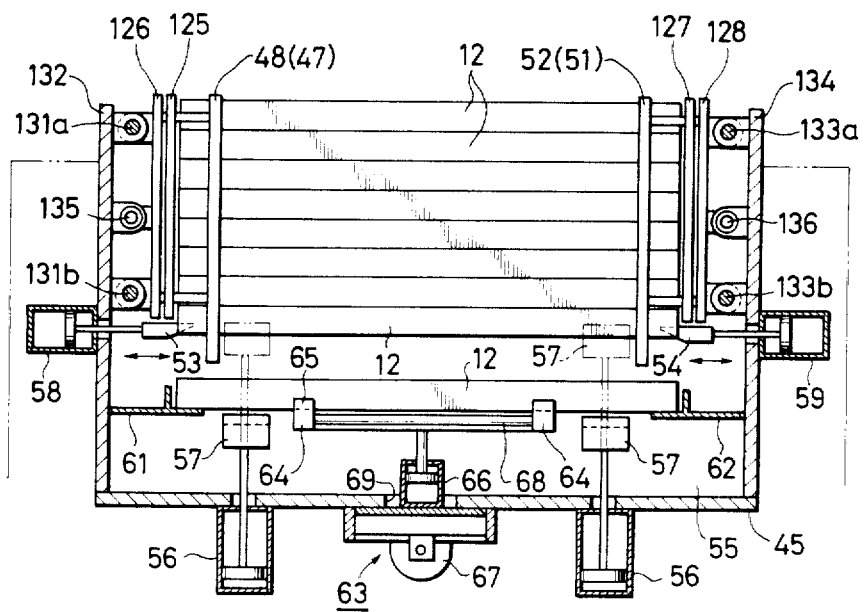
FIG. 7 is a sectional view taken on the line II—II in FIG. 5.

FIGS. 5 through 7 illustrate the IC element loading station 11 which forms one of the principal parts of the present invention. FIGS. 6 and 7 are sectional views taken on the lines I—I and II—II in FIG. 5, respectively. In FIG. 5 the loading station 11 is shown with the magazines taken off. A base 45 is mounted on the controller 40 in spaced relation thereto, and the magazine stocker 13 is mounted on the base 45. In the magazine stocker 13 stacks of magazines 12 are mounted in columns. In this example, six columns 46a to 46f of such stacks of magazines 12 are shown. Magazine guide bars 47, 48 and 51, 52 are held substantially vertically on both sides of opposite end portions of each of the columns 46a to 46f of stacked magazines, respectively, by which the magazines 12 are guided and positioned to be stacked. Each of the columns 46a to 46f of stacked magazines is supported by magazine locking members 53 and 54 inserted under both its ends, as shown in FIG. 7.

A takeout mechanism 55 is provided beneath the columns 46a to 46f of stacked magazines. The takeout mechanism 55 is composed of a pair of drive sources 56 disposed near both ends of the magazines 12 in their lengthwise direction and a pair of support bars 57 which are moved up and down by the drive sources 56. The drive sources 56 can be formed by, for instance, air plungers. The air plungers are fixed underside of the base 45 with their moving rods projecting out upwardly thereof, and the support bars 57 are mounted on the tips of the rods, respectively. The support bars 57 are long enough to extend across all the columns 46a to 46f of stacked magazines. When the support bars 57 are brought up by the drive sources 56, as indicated by the broken lines in FIG. 7, all the columns of stacked magazines 46a to 46f in the bottom row are supported and brought up by the takeout mechanism 55.

When the columns of stacked magazines 46a to 46f are being slightly raised by the takeout mechanism 55, the magazine locking members 53 and 54 are driven out of engagement with the magazines 12 by drive means such as, for example, air plungers 58, 59, and then the support bars 57 of the takeout mechanism 55 are lowered by the thickness of one magazine 12 and stopped. After the takeout mechanism 55 comes to a standstill, the magazine locking members 53 and 54 are engaged with the magazines 12 again. Accordingly, the magazine locking members 53 and 54 engage the magazines 12 second from the bottom, supporting the second and upper magazines 12.

When the magazine locking members 53 and 54 have thus been engaged with the magazines 12 second from the bottom, the support bars 57 of the takeout mechanism 55 are brought down again to transfer the lowermost magazines 12 onto magazine receivers 61 and 62. In this way, a plurality of magazines 12 can be taken out at a time. The magazine receivers 61 and 62 are positioned at opposite end portions of the magazines 12 and extend in the direction parallel to a row of the stacked magazines.

The magazines 12 thus taken out are fed crosswise one by one by means of a stepping mechanism 63. The stepping mechanism 63 is disposed between the magazine receivers 61 and 62, and is made up of carriage bars 64 for moving the magazines 12 arranged on the magazine receivers 61 and 62, ridges 65 formed on the upper face of each carriage bar 64 in parallel to one another to form teeth in a lengthwise direction, a first drive means 66 for moving up the carriage bars 64 and a second drive means 67 for moving the carriage bars 64 in a direction perpendicular to the lengthwise direction of the magazines 12 when the first drive means 66 is lifting up the carriage bars 64. In FIGS. 5 to 7, two such carriage bars 64 are provided, which are interconnected by a coupling members 68, to which is fixed a plunger of the first drive means 66. The first drive means 66 is fixed to a plunger of the second drive means 67. The second drive means 67 is mounted on the underside of the base 45 and the first drive means 66 is positioned in an opening 69 made in the base 45.

After moving up the carriage bars 64 by the first drive means 66 so that the magazines 12 arranged on the magazine receivers 61 and 62 are slightly lifted off therefrom, the carriage bars 64 are moved by the second drive means 67 in the direction of arrangement of the magazines 12 by one pitch of their arrangement. At this time, since the carriage bars 64 have the ridges 65 formed on their upper sides, the magazines 12 are simultaneously stepped crosswise thereof. The carriage bars 64 are moved to the left in FIG. 6 by one pitch of arrangement of the magazines 12, and then brought down by the drive means 66. At this time, the leftmost magazine 12 in FIG. 6 is placed at the left-hand ends of the magazine receivers 61 and 62 and, in the next operation, it is pushed by end portions of the carriage bars 64 onto carrier means 71. Upon receiving the magazine 12, the carrier means 71 is raised by the lift mechanism 11a shown in FIG. 4 and then turned to tilt the magazine 12 with its closed end higher than its open end, as indicated by 12a.

The carriage bars 64 are returned by the second drive means 67 to the right in FIG. 6, and then the magazines 12 are put on the carriage bars 64 again by the operation of the first drive means 66 and the carriage bars 64 carrying the magazines 12 are moved to the left by one pitch. In this way, the magazines 12 are brought step-by-step to the IC element feed position by the stepping mechanism 63. Therefore, when the magazine 12 carried by the carrier means 71 empties and the carrier means 71 returns to its initial position, the next magazine can immediately be transferred onto the carrier means 71.

Figure 8:
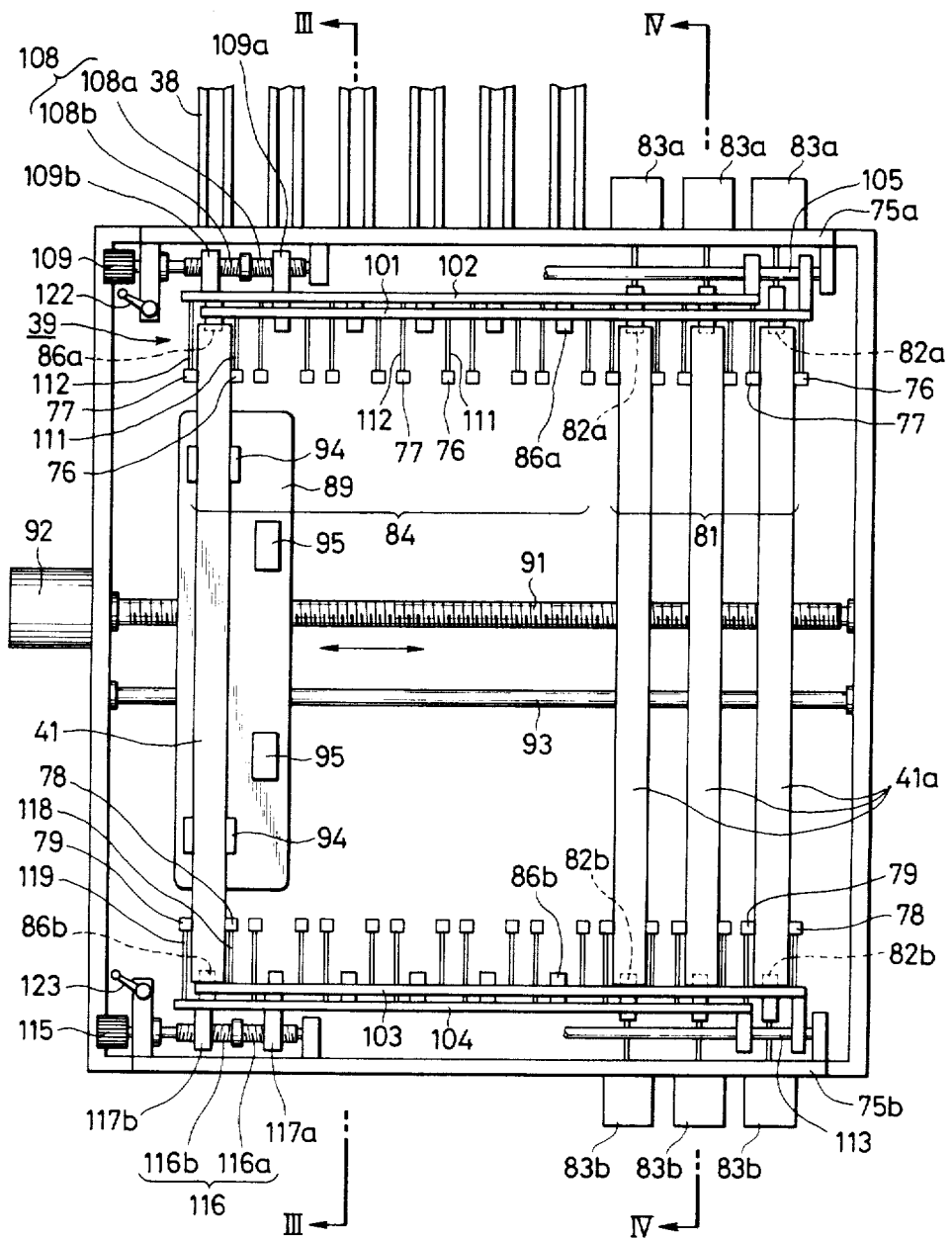
FIG. 8 is a plan view showing an example of an accumulating station 39.
Figure 9:
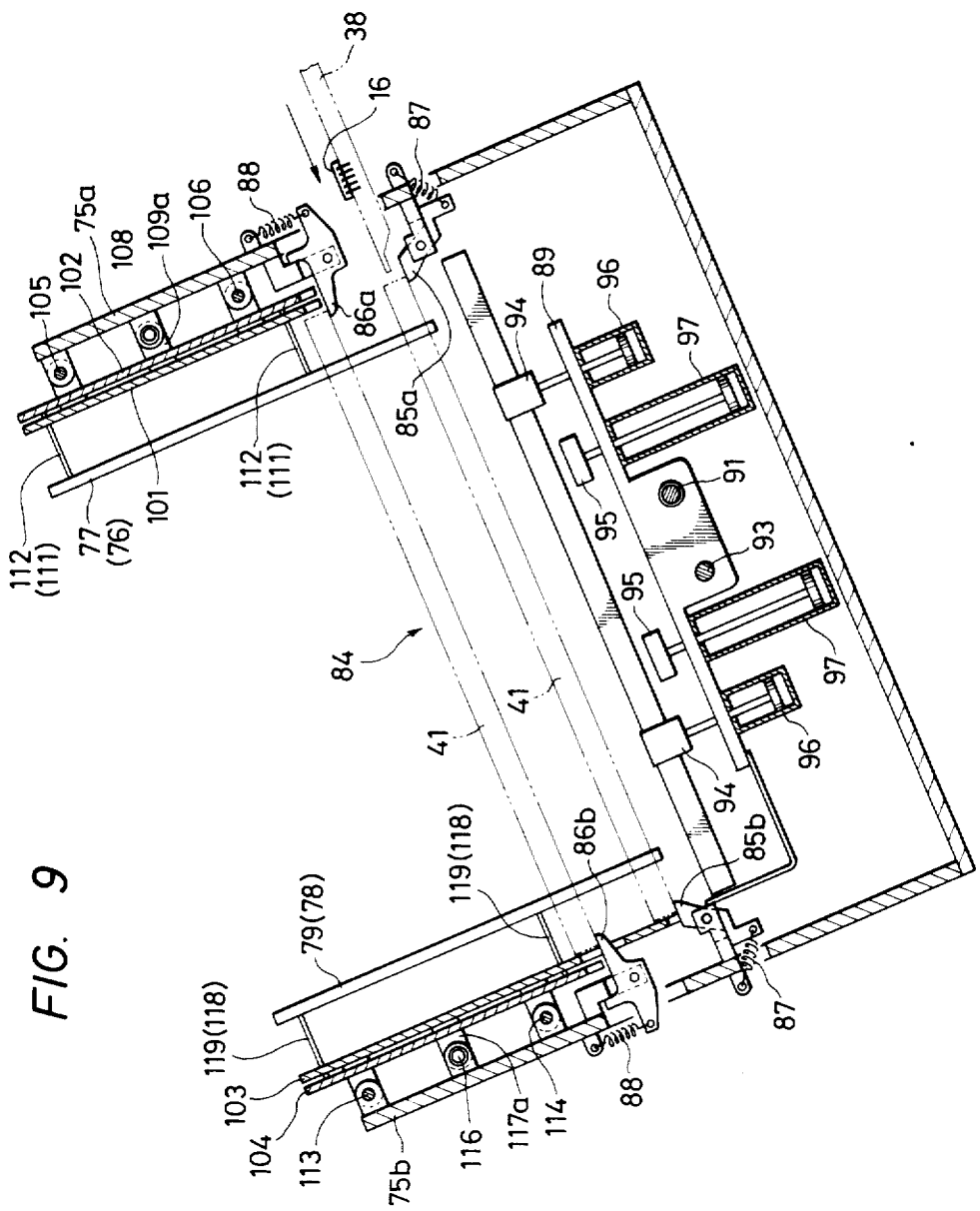
FIG. 9 is a sectional view taken on the line III—III in FIG. 8.
Figure 10:
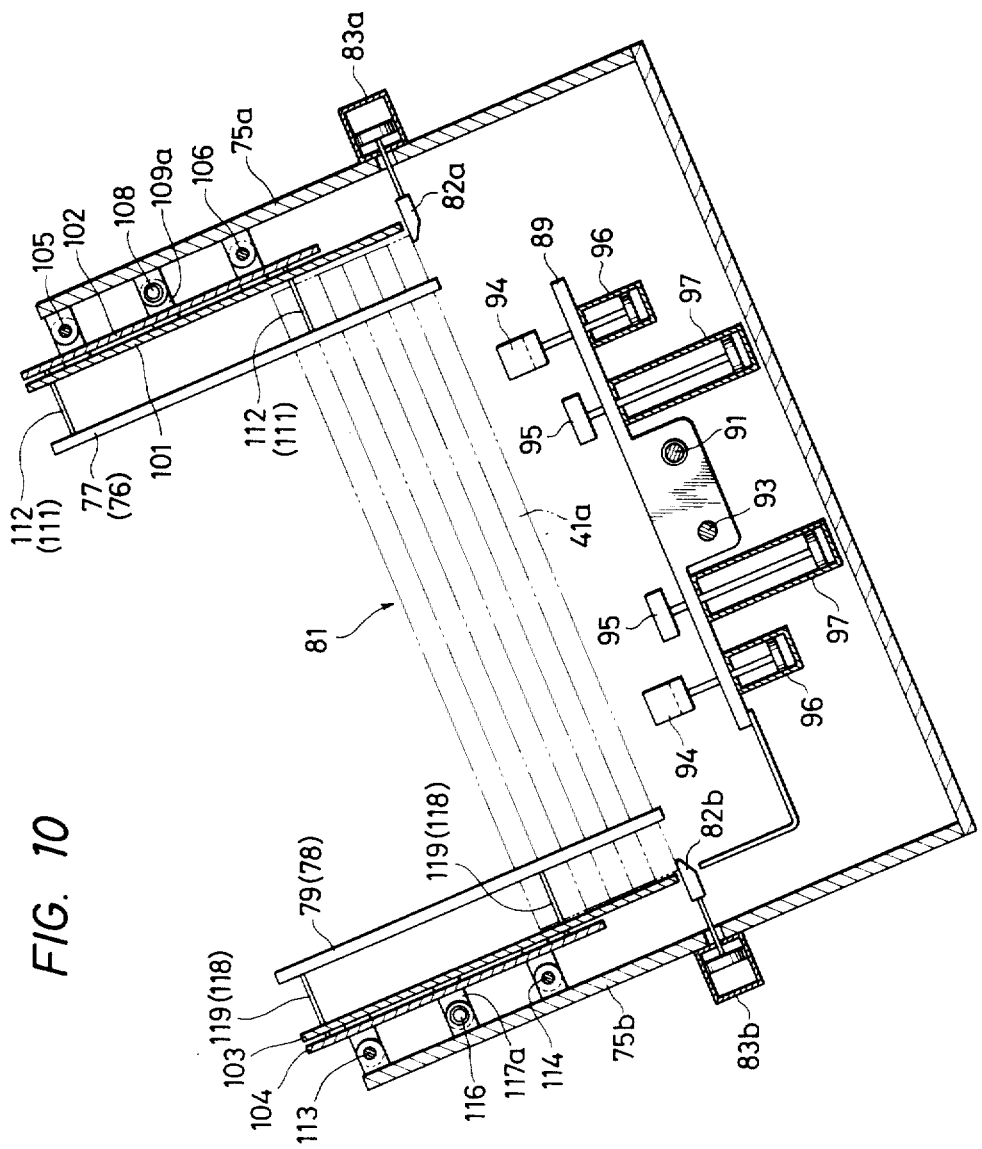
FIG. 10 is a sectional view taken on the line IV—IV in FIG. 8.
Figure 11:
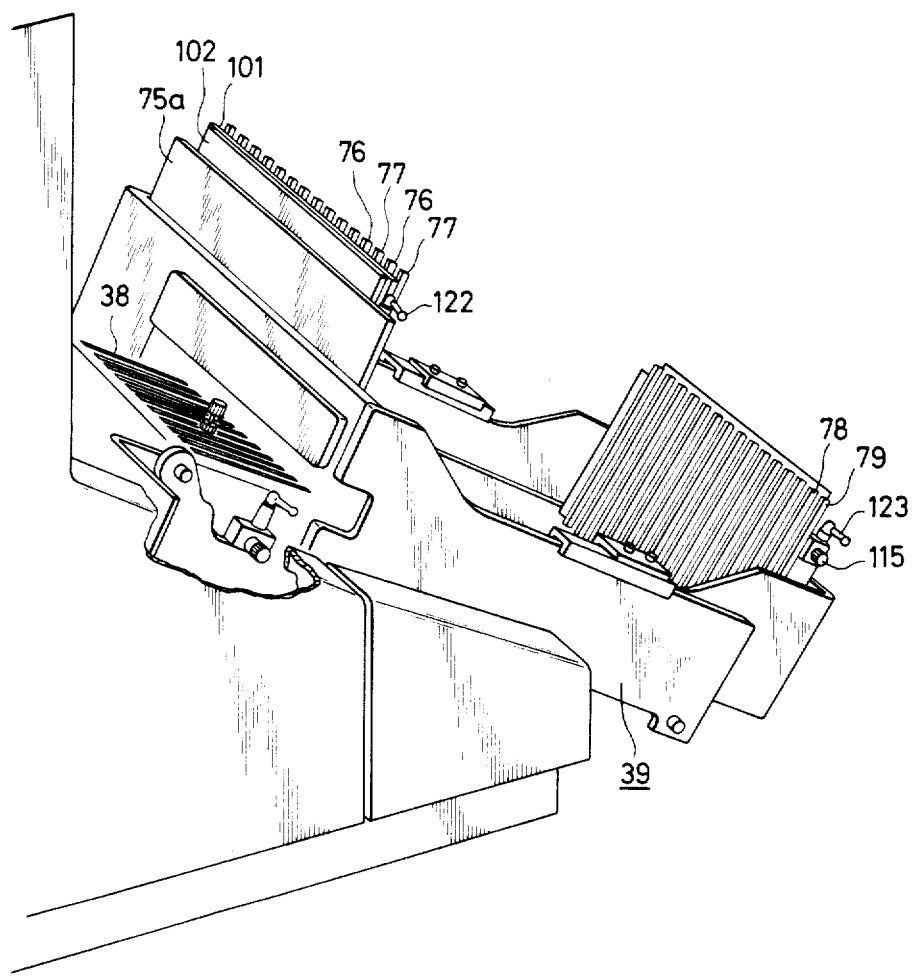
FIG. 11 is a perspective view showing an external appearance of the accumulating station 39.

Next, a description will be given, with reference to FIGS. 8 to 11, of the accumulating station 39 which is another principal part of the present invention. FIG. 8 is a plan view of the accumulating station 39, FIG. 9 a sectional view take on the line III—III in FIG. 8, FIG. 10 a sectional view taken on the line IV—IV in FIG. 8 and FIG. 11 a perspective view of the accumulating station 39. Panels 75a and 75b are parallel and opposite to each other, and pairs of magazine guide bars 76, 77 and 78, 79 are arranged inside of them. In the accumulating station 39 the magazines 41 (41a) are stacked with their opposite end portions held between the magazine guide bars 76 and 77 and between 78 and 79. Three columns on the right-hand side in FIG. 8 indicate an empty magazine stocker room 81. In the empty magazine stocker room 81, for example, 20 empty magazines 41a are stacked. The empty magazines 41a are stacked between the magazine guide bars 76 and 77 and between 78 and 79, and they are supported by hooks 82a and 82b so that they should not fall off, as shown in FIG. 10. The hooks 82a and 82b are driven by air plungers or like drive means 83a and 83b which are mounted on the outside surfaces of the panels 75a and 75b and, as required, operate to let down the lowermost empty magazine. This will be described in detail later.

The portion of the accumulating station 39 other than the empty magazine stocker room 81 is an IC element receiving magazine stocker room 84 for receiving IC elements. In this example, six receiving rails 38 are provided, and the rails 38 and the accumulating station, 39 are inclined so that the IC elements slide down the receiving rails 38 and into the magazines 41. To this end, through holes are made in the panel 75a in alignment with the receiving rails 38 so that the IC elements slide down past the through holes and into the magazines 41. Between the magazine guide bars 76, 77 and between 78 and 79, are provided two pairs of upper and lower self-locking claws 85a, 85b and 86a, 86b to receive the magazines 41.

The lower self-locking claws 85a and 85b hold the magazines 41 in alignment with the receiving rails 38, whereas the upper self-locking claws 86a and 86b support the stacked magazines 41 loaded with the IC elements. When the magazines 41 are pushed up, their end portions engage tapered lower faces of the self-locking claws 85a, 85b and 86a, 86b to turn them upwardly, and when the magazines move up above them, the claws are returned by springs 87 and 88 to their initial positions, respectively, supporting the magazines.

Beneath the empty magazine stocker room 81 and the IC element receiving magazine stocker room 84 is provided a carrying table 89 which reciprocates between them. The carrying table 89 is supported by a guide shaft 93 so that it can be reciprocated by, for instance, a ball screw 91 and a pulse motor 92.

The carrying table 89 is provided with lifts 94 and pushers 95, which can be moved up and down by, for example, air plungers or like drive means 96 and 97, respectively. The lifts 94 thrust up the loaded magazine 41 to a position slightly higher than the self-locking claws 85a and 85b. The pushers 95 boost up the loaded magazine 41 supported by the self-locking claws 85a and 85b to a position slightly higher than them.

In the following manner the empty magazines 41a are sequentially taken out of the empty magazine stocker room 81 and loaded into the IC element receiving magazine stocker room 84. The carrying table 89 is moved so that the lifts 94 come under one of the stacks of empty magazines 41a. When the empty magazines 41a of one stack are all taken out, the empty magazines of the next stack are taken out.

When coming under one stack of empty magazines 41a, the lifts 94 are raised to boost up the stacked empty magazines 41a. Then the drive means 83a and 83b are actuated to move back the hooks 82a and 82b, after which the lifts 94 are lowered by a distance equal to the thickness of one magazine 41a and stopped there. Next, the hooks 82a and 82b are moved forward to their initial positions, where they engage the bottom of the empty magazine 41a second from the bottom, supporting it. In consequence, one empty magazine 41a can be taken out on the lifts 94.

Then the lifts 94 are brought down and the carrying table 89 is moved to carry the empty magazine 41a to a desired position in the IC element receiving magazine stocker room 84, for example, to the leftmost position in FIG. 8. At that position the lifts 94 are moved up to engage the empty magazine 41a with the self-locking claws 85a and 85b, after which the lifts 94 are moved down. Thus the magazine 41a is held at the position where it is engaged with the self-locking claws 85a and 85b, that is, loaded as an IC element receiving magazine 41 in the magazine stocker room 84. Accordingly, the thus loaded, but empty, magazine 41 lies in alignment with the receiving rail 38 for receiving the IC elements 16 which slides down thereto on the rail 38.

In this way, each IC element receiving magazine 41 is positioned opposite one of the receiving rails 38 and the IC elements 16, sorted according to their grades, are received by six magazines 41. When any one of the magazines 41 is loaded to capacity with the IC elements 16 (this is detected by an optical switch), it is pushed up by the pushers 95 to a position higher than the self-locking claws 86a and 86b. When the magazine 41 is thrusted up to that position, the self-locking claws 86a and 86b permit the passage of the magazine 41, and after the magazine 41 has been moved past them upwardly, the self-locking claws 86a and 86b return to their initial position, so the magazine 41 is put on them. When a fully loaded magazine 41 already rests on the self-locking claws 86a and 86b, magazines can be sequentially stacked pushing it up from thereunder.

After pushing up the fully loaded magazine 41 to the height of the self-locking claws 86a and 86b, the pushers 95 are lowered to their initial position. At the same time, the lifts 94 which already have mounted thereon an empty magazine 41a are moved to the position just under the fully loaded magazine and then raised to engage the empty magazine 41a with the self-locking claws 85a and 85b, by which it is loaded for receiving the IC elements.

Figure 12:
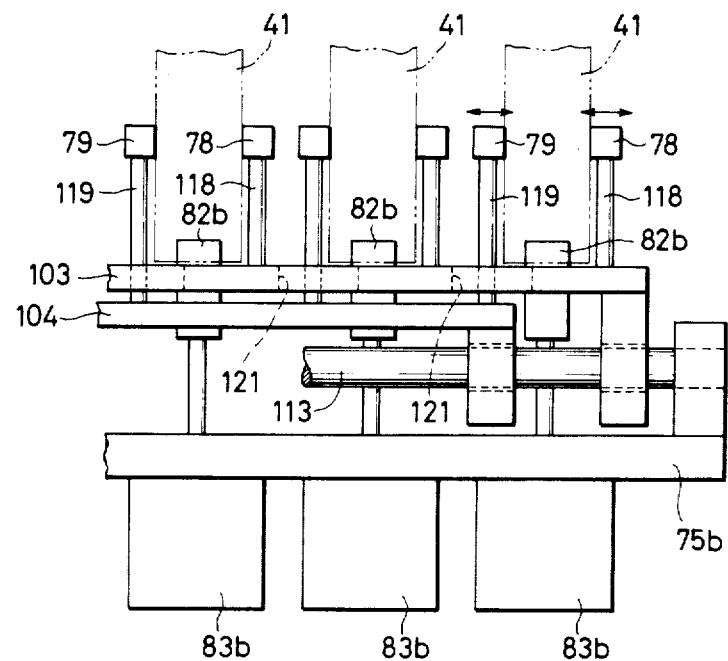
FIG. 12 is an enlarged view showing how magazine guide bars are mounted on a panel 75b in FIG. 8.

The spacing between the magazine guide bars 76 and 77 and the spacing between the bars 78 and 79 can be adjusted according to the sizes of the magazines 41 handled. As shown in FIGS. 8 to 11 and in FIG. 12 which illustrates a part of FIG. 8 on an enlarged scale, the magazine guide bars 76 and 77 are respectively mounted on moving plates 101 and 102 in parallel thereto and the magazine guide bars 78 and 79 are respectively mounted on moving plates 103 and 104 in parallel thereto. The moving plates 101 and 102 are supported, by shafts 105 and 106 (FIG. 9) mounted on the panel 75a, in a manner to be movable in the direction of arrangement of the magazines, and they are connected to a screw 108 (FIG. 8) which is rotated by a knob 107.

The screw 108 extends in the direction of movement of the moving plates 101 and 102, and one half portion 108a and the other half portion 108b of the screw 108 are threaded in opposite directions. The one screw 108a is threadedly engaged with a projecting piece 109a fixed to the moving plate 101, whereas the other screw 108b is similarly threadedly engaged with a projecting piece 109b secured to the moving plate 102. The magazine guide bars 76 are each mounted on the tip of one of bars 111 protrusively provided on the moving plate 101, and the magazine guide bars 77 are each mounted on the tip of one of bars 112 protrusively provided on the moving plate 102. The bars 112 are extended through holes made in the moving plate 101. Likewise, the moving plates 103 and 104 are supported, by shafts 113 and 114 mounted on the panel 75b, in a manner to be movable in the direction of arrangement of the magazines. A screw 116 is rotable by a knob 115, and one half portion 116a and the other half portion 116b of the screw 116 are threaded in opposite directions and threadedly engaged with projecting pieces 117a and 117b secured to the moving plates 103 and 104, respectively. The magazine guide bars 78 and 79 are respectively mounted on the tips of bars 118 and 119 protrusively provided on the moving plates 103 and 104. The bars 119 extend through holes made in the moving plate 104. A clamping handle 122 is used for preventing rotation of the screw 108 after determining the positions of the magazine guide bars 76 and 77, that is, after determining the spacing thereof. Similarly, a clamping handle 124 is provided for the screw 116.

Turning the screws 108 and 109 by the knobs 107 and 115, since the screws 108a and 108b, 109a and 109b are respectively threaded in the opposite directions, the moving plates 101 and 102, 103 and 104 respectively move the same distance in the opposite directions. Accordingly, when using magazines of different widths, the spacing of the magazine guide bars 76 and 77 and the spacing of the magazine guide bars 78 and 79 can be adjusted, as required, by turning the knobs 107 and 115, making it possible to handle magazines of any standards without the necessity of exchanging jigs or the like.

Further, by aligning the centers between the magazine guide bars 76 and 77 and between 78 and 79 with the center of the receiving rail 38 during initialization, they can always be held in alignment with each other. Consequently, by supporting the magazine 41 between the magazine guide bars 76 and 77 and between 78 and 79, the centers of the magazine 41 and the rail 38 can be held in alignment with each other, eliminating the necessity of positioning the rail 38 and the magazine 41 relative to each other.

Unless the magazine 41 is positioned relative to the rail 38 with high accuracy, there is the possibility that IC elements cannot smoothly be loaded into the magazine 41. By providing the magazine guide bar adjusting means individually for the empty magazine stocker room 81 and the IC element receiving magazine stocker room 84, the magazine guide bars of only the magazine stocker room 84 need to be adjusted in spacing with a high degree of accuracy, making the manufacture of the test equipment easier correspondingly. The accumulating station 39 in FIG. 4 has such a construction, as will be understood from the two moving plates on the front side in FIG. 4 which are divided into two and from the provision of clamping handles on both sides of the moving plates.

Such means for adjusting the magazine guide bars in accordance with the types of magazines handled can equally be applied to the IC element loading station 11. FIGS. 5 to 7 show the case where the spacing of the magazine guide bars can be adjusted using the same arrangement as described above. The magazine guide bars 47, 48, 51 and 52 are respectively secured on moving plates 125, 126, 127 and 128. The moving plates 125 and 126 are mounted by shafts 131a and 131b on a support plate 132 in a manner to be movable in the direction of arrangement of the magazines 12, and similarly, the moving plates 127 and 127 are mounted by shafts 133a and 133b on a support plate 134 in a manner to be movable in the direction of arrangement of the magazines 12. The moving plates 125 and 126 are threadedly engaged with oppositely threaded portions of a screw 135, and the moving plates 127 and 128 are also threadedly engaged with oppositely threaded portions of a screw 136. The screws 135 and 136 are rotatable by knobs 137 and 138, respectively, and their rotational positions can be clamped by handles 141 and 142, respectively.

In the above, when the magazine guide bar adjusting means are provided in the loading station 11 and the accumulating station 39, both ends of the magazines 12 and 41 are guided and positioned by the inner moving plates 101 and 103 and by 125 and 127, respectively. In FIG. 9, it is possible to omit the self-locking claws 86a and 86b and to employ an arrangement wherein the fully loaded magazine 41 is pushed up by the lifts 94 through the empty magazine put thereon and the empty magazine is held by the self-locking claws 85a and 85b. In such an instance, the pushers 95 can be dispensed with.

As described above, according to an aspect of the present invention, a plurality of columns of stacked magazines are arranged at substantially equal intervals in the magazine stocker 13 of the IC element loading station 11, and the magazines of the respective columns, six in the illustrated example, are simultaneously lowered and fed, pitch by pitch, by intermittent feed. Accordingly, the rate of supply of IC elements can be increased higher than in the case where magazines are brought down, one by one, from each stack of magazines, and the capabilities of the IC test equipment can be enhanced.

According to another aspect of the present invention, the empty magazine stocker room 81 is provided in the accumulating station 39 so that an empty magazine can automatically be supplied to any magazine loading position in the IC element receiving magazine stocker room 84. This releives the operator of the necessity of constantly observing the loading of defective elements receiving magazines with defective elements and manually replacing a fully loaded magazine with an empty magazines. Furthermore, one stack of empty magazines is not prepared for each IC element receiving position, but instead empty magazines in the empty magazine stocker room can be supplied to any IC receiving position. Therefore, the empty magazine stocker room can effectively be used and the space therefor is small. Besides, the empty magazines are taken out of the empty magazine stocker room 81 and loaded in the IC element receiving magazine stocker room by the same means, and this also makes the accumulating station small and inexpensive.

While in the above, the IC elements move by their own weight to the respective stations, various carrier means may also be employed. The preheating station can be omitted. The present invention is equally applicable to equipment which has no IC element heating means and tests IC elements at room temperature alone. Also it is possible to omit the receiving rails 38 and to feed IC elements directly from the sorting station 36 to the IC receiving magazines 41 in the accumulating station 39.

It will be apparent that many modifications and variations may be effected without departing from the scope of the novel concepts of the present invention.

What is claimed is:

1. IC element test equipment comprising:
   an IC element loading station for loading IC elements to be tested;
   a testing station for testing the IC elements supplied from the IC element loading station;
   a sorting station, supplied with the IC elements tested in the testing station, for sorting the IC elements according to their test results; and
   an accumulating station for receiving the IC elements sorted in the sorting station;
   wherein the accumulating station comprises:
   an IC element receiving magazine stocker room for receiving therein a plurality of stacks of elongated magazines, said IC receiving magazine stocker room including a first plurality of guide and positioning means for receiving the plural stacks of magazines in parallel with one another so that the lowermost ones of the stacked magazines are positioned on respective extensions of passages of supply of the sorted IC elements from said sorting station;
   an empty magazine stocker room disposed on one side of said IC element receiving magazine stocker room, for receiving therein a plurality of stacks of empty magazines, said empty magazine stocker room including a second plurality of guide and positioning means for receiving respective stacks of magazines in parallel to one another and to the stacks of magazines in said first plurality of guide and positioning means;
   a carrying table disposed below said empty magazine stocker room and said IC element receiving magazine stocker room and reciprocating between thereunder in a lateral direction with respect to the stacked magazines; and
   takeout and loading means mounted on said carrying table, for taking out a selected one of the lowermost empty magazines from said empty magazine stocker room onto said carrying table and loading it on a selected one of the extensions of passages from underside thereof in the IC element receiving magazine stocker room.

2. IC element test equipment according to claim 1 wherein hooks are provided in the empty magazine stocker room in a manner to be movable back and forth with respect to both ends of the lowermost one of the stacked magazines, for supporting the lowermost empty magazine and those stacked thereon; the takeout and loading means is a lift which is mounted on the carrying table in a manner to be movable up and down and is capable of holding the stacked magazines by pushing up the lowermost one; the IC element receiving magazine on each extension of the IC element passage is supported at both ends by self-locking claws; and when an empty magazine is pushed up from under the IC element receiving magazine, the self-locking claws initially are turned upwardly but then return to their normal position to hold the empty magazine.

3. IC element test equipment according to claim 2 wherein pushers capable of pushing up the stacked magazines are mounted, as a part of the takeout and loading means, on the carrying table in a manner to be movable up and down, the pushers being deviated from the lift in the direction of movement of the carrying table; and magazines stacked on the IC receiving magazine on the extension of the IC element passage in the IC element receiving magazine stocker room are held at both ends by retractable claws.

4. IC element test equipment according to claim 1 wherein each of the guide and positioning means comprises a pair of magazine guide bars provided for each column of stacked magazines, for guiding therebetween the magazines to be stacked; and each pair of guide bars can be moved by adjusting means the same distance in opposite directions so as to adjust their spacing.

5. IC element test equipment according to claim 4 wherein a pair of magazine guide bars are provided for each end portion of each column of stacked magazines.

6. IC element test equipment according to claim 5 wherein first ones of the magazine guide bars of the respective pairs at both end portions are respectively secured to first and second moving plates; and the first and second moving plates are opposite each other and guide and position both ends of the magazines.

7. IC element test equipment according to claim 6 wherein the second magazine guide bars of the respective pairs are respectively secured to first and second moving members; the first moving plate and the first moving member are respectively in threaded engagement with one half portion and the other half portion of a first screw extending in the direction of their movement, the one half portion and the other half portion of the first screw being threaded at the same pitch but in opposite directions; and the second moving plate and the second moving member are respectively in threaded engagement with the one half portion and the other half portion of a second screw extending in the direction of their movement, the one half portion and the other half portion of the second screw being threaded at the same pitch but in opposite directions.

8. IC element test equipment according to claim 7 wherein the adjusting means is provided in each of the IC element receiving magazine stocker room and the empty magazine stocker room.

* * * * *

UNITED STATES PATENT AND TRADEMARK OFFICE
CERTIFICATE OF CORRECTION

PATENT NO. : 4,715,501

DATED : Dec. 29, 1987

INVENTOR(S) : SATO et al.

It is certified that error appears in the above-identified patent and that said Letters Patent is hereby corrected as shown below:

Col. 2

Line 15, delete "ro" and insert --to--.

Col. 10

Line 27, delete "127" (second occurrence) and insert --128--;
Line 67, delete "releives" and insert --relieves--.

Signed and Sealed this

Twenty-eighth Day of June, 1988

Attest:

DONALD J. QUIGG

Attesting Officer

Commissioner of Patents and Trademarks